SEMICONDUCTOR CIRCUIT ASSEMBLIES

Filed April 24, 1963 2 Sheets-Sheet 1

Inventor
ALAN ARTHUR SHEPHERD
By
Cameron, Kerkam & Sutton
Attorneys

Inventor
ALAN ARTHUR SHEPHERD
By
Cameron, Kerkam & Sutton
Attorneys

United States Patent Office 3,379,937

Patented Apr. 23, 1968

3,379,937

SEMICONDUCTOR CIRCUIT ASSEMBLIES

Alan Arthur Shepherd, Bramhall, England, assignor to Ferranti, Limited, Hollinwood, Lancashire, England, a company of Great Britain and Northern Ireland Filed Apr. 24, 1963, Ser. No. 275,412
Claims priority, application Great Britain, Apr. 27, 1962, 16,085/62
12 Claims. (Cl. 317—101)

Figure 1:
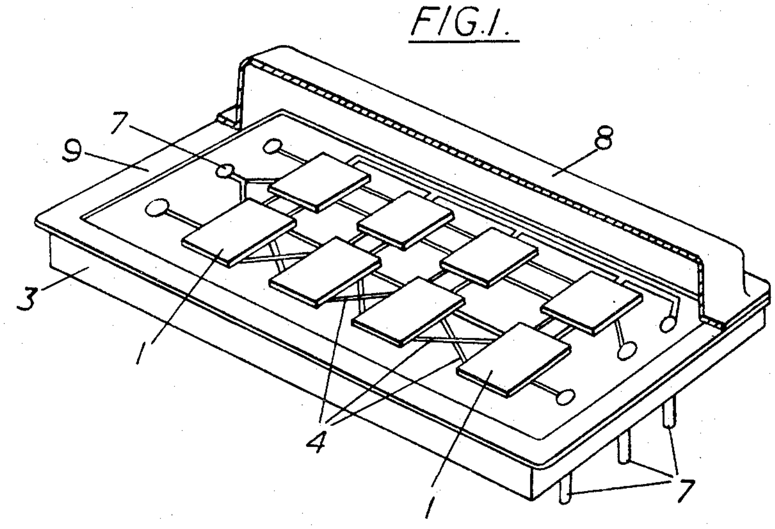

This invention relates to semiconductor circuit assemblies.

Semiconductor devices are now known which comprise a slice of semiconductor material having an electrical circuit formed on the slice and the circuit terminations on one face. To prevent excessive wastage during manufacture the number of components formed on a single slice is restricted, approximately twenty components being the maximum number formed on any one slice at present. Therefore, to form a circuit having a large number of components it is necessary to form an assembly of several of the above devices having their individual circuits interconnected.

It is an object of the present invention to provide a semiconductor circuit assembly comprising a plurality of the above devices having their individual circuits interconnected.

It is also an object of the present invention to provide a method of manufacturing such a semiconductor circuit assembly.

According to the present invention a semiconductor circuit assembly includes a plurality of slices of semiconductor material each having an electrical circuit formed thereon and the circuit terminations on one face, and a block of electrically non-conductive material having deposited on one face a plurality of electrically conductive strips for interconnecting the circuits of said semiconductor slices, said slices being disposed with said one face of each slice in close proximity to said one face of said block, said circuits being connected to said conductive strips by means of metallic particles bonded to said strips and to said circuit terminations.

Said block may be provided with indentations in said one face for locating said particles, said strips extending into said indentations.

Also in accordance with the present invention a method of manufacturing a semiconductor circuit assembly comprising a plurality of slices of semiconductor material each having an electrical circuit formed thereon and the circuit terminations on one face, and a block of electrically non-conductive material having deposited on one face a plurality of electrically conductive strips for interconnecting the circuits of said semiconductor slices, includes the steps of locating metal particles with respect to said strips on said block, locating said semiconductor slices with the appropriate ones of said circuit terminations in contact with said metal particles, and bonding said particles to said strips and to said circuit terminations.

Said block may be provided with indentations for locating said metal particles, said strips extending into said indentations, and said particles may be in the form of spheres having a diameter such that when a particle is located in one of said indentations said particle projects above the surface of said block. Furthermore, said particles may be bonded to said strips and said circuit terminations by heating the assembly and applying sufficient pressure between said slices and said block to exceed the yield point of said metal particles to form a compression bond between said particles and said strips and said circuit terminations.

Figure 2:
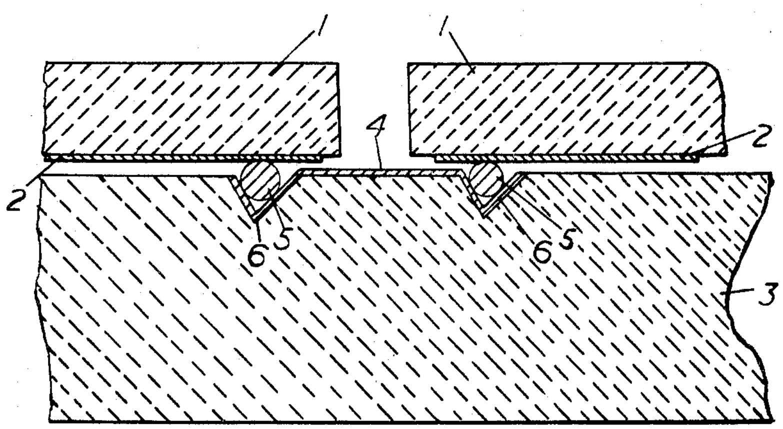
Figure 3:
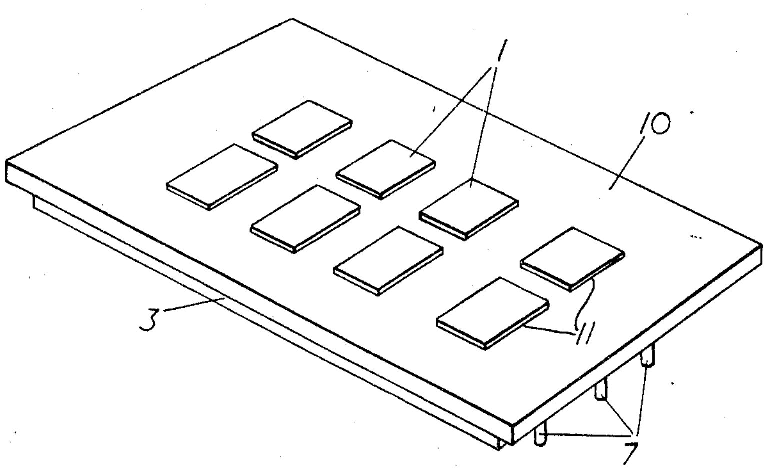

One embodiment of the present invention will now be described by way of example with reference to the accompanying drawings in which:

FIGURE 1 is a perspective view of a semiconductor circuit assembly in accordance with the invention, FIGURE 2 is an enlarged sectional elevation of part of FIGURE 1, and FIGURE 3 shows one stage during the manufacture of the assembly shown in FIGURE 1.

Referring now to FIGURES 1 and 2 of the drawings the semiconductor circuit assembly shown includes eight slices 1 of silicon each having an electrical circuit formed thereon in known manner by a suitable technique, such as a masked diffusion technique. The circuits include components (not shown) such as transistors and diodes, evaporated aluminium conductors such as 2 (FIGURE 2) forming the connections between the circuit components. The circuit terminations are all on one face of the slice and may be formed either by the aluminium conductors 2 or, in the case of components such as transistors and diodes, by an electrode of the component itself. Each of the slices 1 is disposed with the circuit terminations in close proximity to one face of a block 3 of ceramic material on which face is provided a plurality of evaporated aluminium conductors 4 for interconnecting the circuits on the slices 1. The circuit terminations such as the conductors 2 on the slices 1 are connected to the conductors 4 on the block 3 by means of gold particles 5 located in conical indentations 6 into which the conductors 4 extend, the particles 5 being bonded to the conductors 4 and to the circuit terminations by means of a compression bond.

The circuit assembly is connected to an external circuit and power supplies by pins 7 which extend through the block 3 and which are connected to the circuit assembly by the conductors 4. The assembly is enclosed by a metal cap 8 cold welded to a metal frame 9 secured to the block 3.

In manufacturing the assembly described above the block 3 is dusted with spherical gold particles to locate one particle 5 in each indentaton 6 in the block 3, the particles 5 being of such diameter that they project above the surface of the block 3. A jig 10 (FIGURE 3) is then secured to the block 3 and the slices 1 of silicon are placed in apertures 11 in the jig 10 to locate the slices 1 with respect to the conductors 4 on the block 3 with the circuit terminations in contact with the gold paricles 5. The assembly is then heated to approximately 350° C. and sufficient pressure exerted between the slices 1 and the block 3 to exceed the yield point of the gold particles and form a compression bond between the particles 5 and the conductors 4 and the circuit terminations such as the conductor 2. The thickness of the conductors 2 is less than one micron and the particles 5 have a diameter of .010 inch and the difference in bonding the particles 5 to a circuit termination such as the conductor 2 or directly to a component termination is therefore negligible especially since any slight irregularities are absorbed by the gold spheres during the bonding operation. After cooling, the jig 10 is removed and the cap 8 secured to the frame 9 by cold welding.

The assembly described above may be modified in many ways. For example, the gold particles 5 may be replaced by aluminium particles and the conductors 2 and 4 may be of a metal other than aluminium, such as gold. Also the shape of the indentations 6 in the block 3 may be other than conical since the gold particles will be deformed to conform to the shape of the indentation' at the point of contact during the compression bonding action. Furthermore, the block 3 may be of an electrically non-conductive material other than a ceramic material.

What I claim is:

1. A semiconductor circuit assembly including a plurality of slices of semiconductor material each having an electrical circuit formed thereon and having the circuit terminations on one face, and a block of electrically non-conductive material having deposited on one face a plurality of electrically conductive strips for interconnecting the circuits of said semiconductor slices, said slices being disposed with said one face of each slice in close proximity to said one face of said block, said circuits being connected to said conductive strips by means of metallic particles bonded to said strips and to said circuit terminations.

2. A circuit assembly as claimed in claim 1 in which said block is provided with indentations in said one face for locating said particles, said strips extending into said indentations.

3. A circuit assembly as claimed in claim 2 in which said indentations are conical.

4. A circuit assembly as claimed in claim 1 in which said particles are bonded to said strips and said circuit terminations by a thermo compression bond.

5. A circuit assembly as claimed in claim 4 in which said strips are aluminium and said particles are of gold.

6. A circuit assembly as claimed in claim 1 in which said block is of ceramic material.

7. A semiconductor circuit assembly comprising an electrically non-conductive block having deposited on one face thereof a plurality of electrically conductive strips, means arranged on said block for connecting said conductive strips to a source of electrical power, a plurality of slices of semiconductor material each having an electrical circuit formed thereon and having the circuit terminations on one face thereof, each of said slices being disposed with said one face in close proximity to said one face of said block, means for connecting the electrical circuits of said slices to said conductive strips including a plurality of selectively positioned metallic particles bonded to said conductive strips and to said circuit terminations, and covering means secured to said block for protecting said slices against atmospheric contamination and mechanical damage.

8. A semiconductor circuit assembly as claimed in claim 7 in which said particles are bonded to said conductive strips and said circuit terminations by a compression bond.

9. A semiconductor circuit assembly as claimed in claim 7 in which said conductive strips are of aluminium and said particles are of gold.

10. A semiconductor circuit assembly comprising a frame, an electrically non-conductive block supported on said frame, a cap member secured to said frame forming an enclosure for the circuit assembly, said block having deposited on one face thereof a plurality of electrically conductive strips, means arranged on said block for connecting said conductor strips to a source of electrical power, a plurality of slices of semiconductor material arranged within said cap, each of said slices having an electrical circuit formed thereon and having the circuit terminations on one face thereof, each of said slices being disposed with said one face in close proximity to said one face of said block, and means for bridging the space between said faces including a plurality of selectively positioned metal particles arranged to connect the electrical circuits of said slices to said conductive strips.

11. A semiconductor circuit assembly as claimed in claim 10 wherein said block is provided with indentations in said one face thereof for locating said metal particles.

12. A semiconductor circuit assembly as claimed in claim 11 wherein said conductive strips are arranged within said indentations and said metal particles are of such size to project above the face of said block to permit compression bonding thereof to the circuit terminations and the conductive strips.

References Cited

UNITED STATES PATENTS

| | | | |
|---|---|---|---|
| 2,981,877 | 4/1961 | Noyce | 317—235 |
| 3,006,067 | 10/1961 | Anderson et al. | 29—470 |
| 3,072,832 | 1/1963 | Kilby | 317—235 |
| 3,114,867 | 12/1963 | Szekely | 317—235 |
| 2,557,790 | 6/1951 | Launey | 338—323 |
| 2,570,163 | 10/1951 | Scott et al. | 338—323 |
| 2,728,835 | 12/1955 | Mueller | 338—309 |
| 2,758,256 | 8/1956 | Eisler | 338—309 |
| 3,119,052 | 1/1964 | Tsuji | 317—234 |
| 3,138,744 | 6/1964 | Kilby | 317—101 |
| 3,148,310 | 9/1964 | Feldman | 317—101 |
| 3,134,935 | 5/1964 | Parsons et al. | 317—234 |
| 3,184,831 | 5/1965 | Siebertz. | |
| 3,202,888 | 8/1965 | Evander et al. | |

OTHER REFERENCES

"Design and Fabrication of a Microelectronic I.F. Amplifier," by J. R. Black, 1960 IRE Wescon Convention Record, vol. 3, pt. 4, pages 114–118, dated Aug. 23, 1960.

"The Construction of a Thin-Film Integrated Circuit I.F. Amplifier," by J. R. Black, 1960 Proceedings of the National Electronics Conference, vol. XVI, pp. 211–219, dated Oct. 10, 1960.

ROBERT S. MACON, *Primary Examiner.*

H. T. POWELL, J. J. BOSCO, *Assistant Examiners.*